United States Patent
Ihm

(10) Patent No.: US 6,465,813 B2
(45) Date of Patent: *Oct. 15, 2002

(54) CARBON NANOTUBE DEVICE

(75) Inventor: Ji Soon Ihm, Seoul (KR)

(73) Assignee: Hyundai Electronics Industries Co., Ltd., Ichon-shi (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/270,825

(22) Filed: Mar. 18, 1999

(65) Prior Publication Data

US 2002/0020841 A1 Feb. 21, 2002

(30) Foreign Application Priority Data

Jun. 16, 1998 (KR) ............................... 98-22588

(51) Int. Cl.$^7$ ............................................. H01L 31/072
(52) U.S. Cl. ..................... 257/183; 257/197; 257/557; 257/565
(58) Field of Search ................. 257/14, 9, 77, 257/183, 197, 76, 557, 565

(56) References Cited

U.S. PATENT DOCUMENTS 6,280,677 B1 * 8/2001 Yakobson ................. 264/430
6,325,904 B1 * 12/2001 Peeters ..................... 204/403

OTHER PUBLICATIONS

Tans, et al. "Room–Temperature Transistor Based On A Single Carbon Nanotube," Nature, vol. 393, May 7, 1998, pp. 49–52.
Bochrath et al., Science, vol. 275, pp. 1922–1925, Mar., 1997.
Andrea Thess, et al. "Crystalline Ropes of Metallic Carbon Nanotubes;" Nature, vol. 273, Jul. 26, 1996 pp. 483–487.
D.S. Bethune, et al. "Cobalt–catalysed growth of carbon nanotubes with single–atomic–layer walls;" Nature, vol. 363, Jun. 17, 1993, pp. 605–607.
M.S. Dresselhaus, "New tricks with nanotubes;" Nature, vol. 391, Jan. 1, 1998; pp. 19–20.
Jeroen W.G. Wildoer, et al., "Electronic structure of atomically resolved carbon nanotubes;" Nature, vol. 391, Jan. 1, 1998; pp. 59–64.
Paul Delaney, et al., "Broken symmetry and pseudogaps in ropes of carbon nanotubes;" Nature, vol. 391, Jan. 29, 1998; pp. 466–468.

* cited by examiner

*Primary Examiner*—Sara Crane
(74) *Attorney, Agent, or Firm*—Fleshner & Kim, LLP

(57) ABSTRACT

Transistor, is disclosed, including a base having a bundle of (n,n) nanotubes, and an emitter and a collector connected to opposite sides of the base each having (n,m, n–m≠3l) nanotubes, whereby substantially reducing a device size and improving an operation speed as the carbon nanotube has a thermal conductivity much better than silicon.

19 Claims, 3 Drawing Sheets

CARBON NANOTUBE DEVICE

BACKGROUND OF THE INVENTION

1. Field of the Invention

The present invention relates to a transistor, and more particularly, to a junction type transistor of carbon nanotubes.

2. Discussion of the background Art

There are a horizontal, and vertical types in background art junction type transistors. The background art junction transistor will be explained with reference to the attached drawings. FIG. 1a illustrates a plane view of the background art junction transistor and FIG. 1b illustrates a sectional view of the background art junction transistor.

Referring to FIGS. 2a and 2b, there is a background art PNP junction transistor having an n type epitaxial layer 2 isolated by a silicon oxide film 3 formed on a substrate 1. There are p type impurity regions 4 and 5 at fixed intervals in the n type epitaxial layer 2, wherein the p type impurity region 4 serves as a collector of a transistor and the p type impurity region 5 serves as an emitter of the transistor.

The aforementioned background art junction transistor has the following problems.

The limitation in fabrication of the background art transistor that an NPN transistor fabrication as well as circuit integration should be done on the same time, a geometry of the background art transistor is not optimal for preventing electron-hole couplings and collecting holes at collectors in a base.

Second, the comparatively high doping concentration in the collector with a thick depletion layer in the base degrades a performance, and conduction of additional diffusion in an effort to overcome such demerit results in a complicated fabrication process.

Third, even though the vertical type junction transistor fabricated in an effort for solving the aforementioned background art problems of the transistor may more or less help in an improvement of the performance, the fabrication of vertical type junction transistor requires significant cost increase and effort since it requires totally different fabrication process.

SUMMARY OF THE INVENTION

Accordingly, the present invention is directed a transistor that substantially obviates one or more of the problems due to limitations and disadvantages of the related art.

An object of the present invention is to provide a transistor having carbon nanotubes which has improved performances and simple fabrication process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the transistor of carbon nanotubes includes a base having a bundle of (n,n) carbon nanotubes, and an emitter and a collector having (n,m, n−m≠3l) nanotubes connected to opposite sides of the base respectively.

A single carbon nanotube has a diameter not greater than approximately 1 nm, is metallic or semiconductive depending on atomic array of the carbon in the tube, and can be doped with p type impurities, but not with n type impurities.

A bundle of a few tens of metallic carbon nanotubes forms a so called pseudo gap with an electron and a hole present on the same time. Upon application of a bias to such a nanotube bundle, electrons or holes are caused to enter more or to enter less even if not doped with impurities.

Accordingly, in the transistor of carbon nanotubes of the present invention, a bundle of carbon nanotube is used as a base part of the transistor, one single line or a few lines of carbon nanotubes are used as the emitter and the collector, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1A:
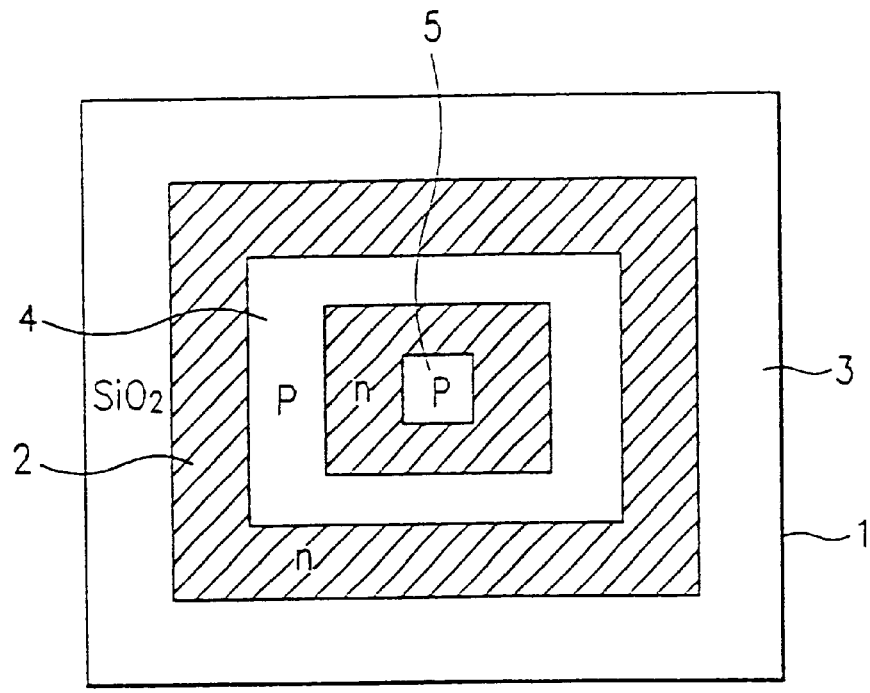
FIG. 1a illustrates a plane view of the background art junction transistor.
Figure 1B:
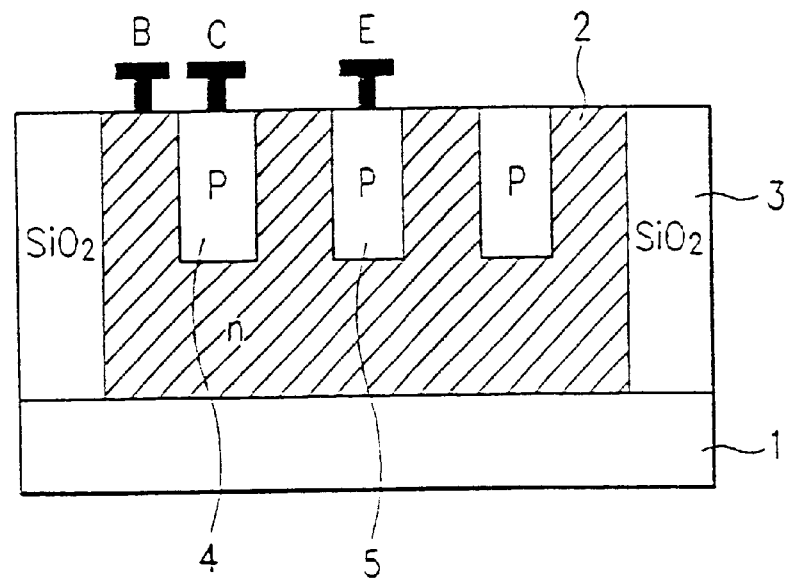
FIG. 1b illustrates a sectional view of the background art junction transistor.
Figure 2:
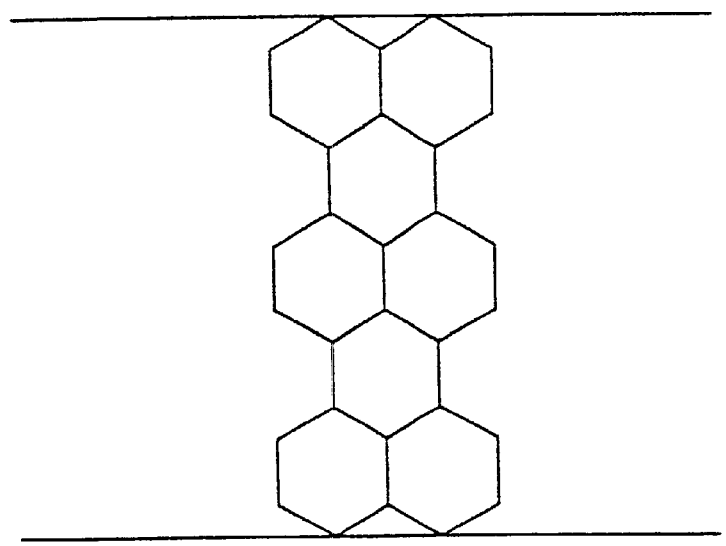
FIG. 2 illustrates an atomic array of a metallic carbon nanotube of the present invention.

Reference will now be made in detail to the preferred embodiments of the present invention, examples of which are illustrated in the accompanying drawings. FIG. 2 illustrates an atomic array of a metallic carbon nanotube of the present invention, FIG. 3 illustrates an atomic array of a semiconductive carbon nanotube of the present invention, and FIG. 4 illustrates a PNP junction type transistor of carbon nanotubes in accordance with a preferred embodiment of the present invention.

The carbon nanotubes are classified into metallic carbon nanotubes and semiconductive carbon nanotubes according to an atomic array in the carbon nanotube. As shown in FIG. 2, a single line of the metallic carbon nanotube has a hexagonal pattern of an atomic array of the carbons at a 90° to a tube axis. That is, the metallic carbon nanotube is, in technical term, called as (n,n) nanotube or armchair nanotube. The "n" represents an integer denoting a size, and the two characters are the same, the tubes have the same properties with only difference in their diameters. In general, the (n,n) carbon nanotubes are (10,10) carbon nanotubes.

Figure 3:
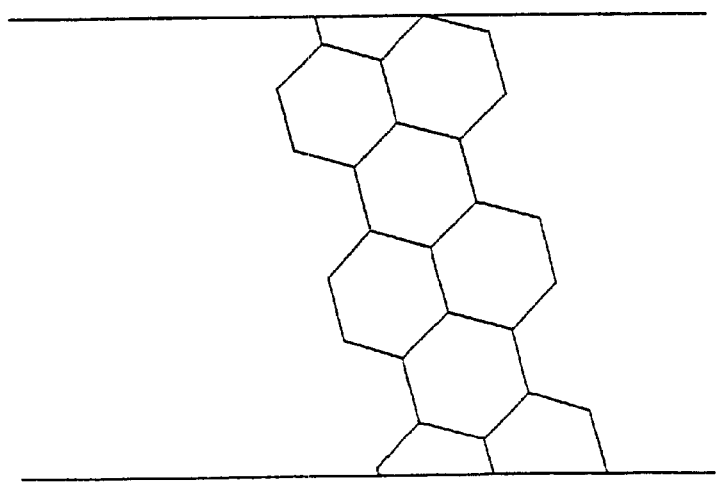
FIG. 3 illustrates an atomic array of a semiconductive carbon nanotube of the present invention; and, FIG. 4 illustrates a transistor of carbon nanotubes in accordance with a preferred embodiment of the present invention.

And, as shown in FIG. 3, a semiconductive carbon nanotube has a hexagonal pattern of an atomic array of the carbons at, not a 90°, but slightly sloped(smaller than 90°), to a tube axis. The aforementioned semiconductive carbon nanotube is called in technical term as (n,m) (n−m≠3l) carbon nanotubes. That is, the "n" and "m" should not be a multiple of 3, for example (10,0) or (11,0) carbon nanotube is a specific example, with an energy gap of 1 eV.

Figure 4:
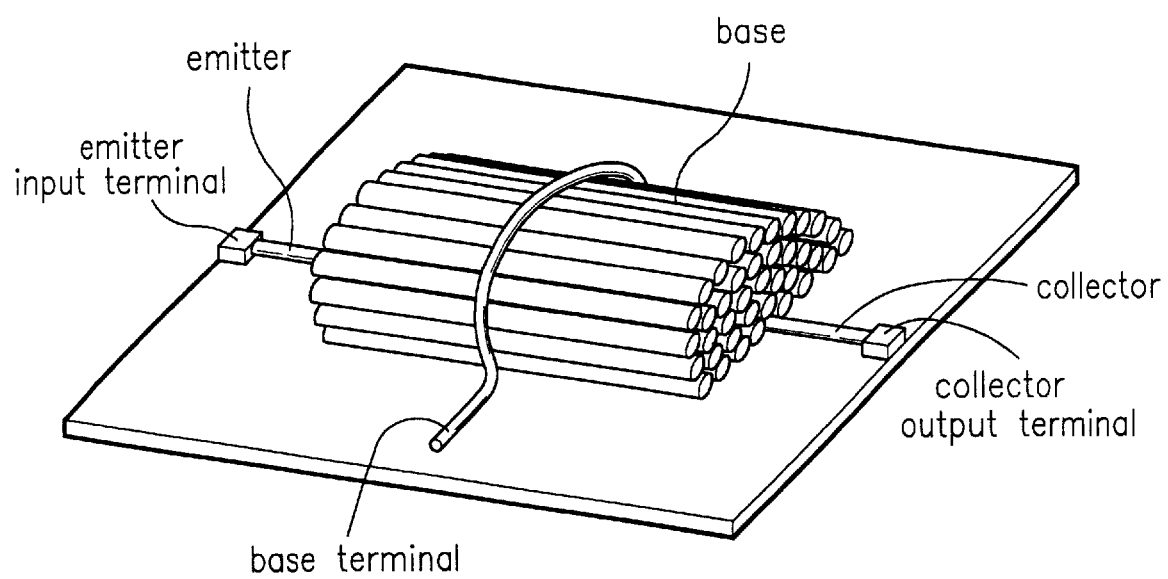

The transistor in accordance with one preferred embodiment of the present invention, of carbon nanotubes having the aforementioned properties is shown in FIG. 4. That is, as explained, a base part in the transistor includes a bundle of metallic carbon nanotube. The bundle has diameter x width at least 5 nm×6 nm. An emitter part in the transistor includes one single line or a few lines of semiconductive carbon nanotubes of large energy gap doped with "p" type impurity (for example, boron). Finally, a collector in the transistor includes one single line or a few lines of semiconductive carbon nanotubes of large energy gap doped with "p" type impurity (for example, boron) at a concentration lighter than the emitter. And, an electrode of a metal or metallic carbon nanotube is formed at a middle of a base region, the one bundle of carbon nanotubes, and, electrodes are also formed at ends of the emitter and the collector. In the aforementioned transistor of the present invention formed thus, unlike the background art transistor, the base region has no depletion region because the base region is not formed by an artificial doping, and, instead, acts similar to a kind of battery because an energy level of the base region either rises or drops depending on a net charge of entire base region.

The operation of the aforementioned transistor of carbon nanotube of the present invention will be explained.

Basic operation of the transistor of carbon nanotube of the present invention is the same with the background art transistor. However, the transistor of carbon nanotube of the present invention differs slightly due to unusual electric properties of the carbon nanotube bundle in the base. When an orderly direction operation is explained, though a background art transistor can provide a good performance (reducing a leakage current and having a high gain) only when a voltage $V_{EB}$ between the emitter and the base is a little bit positive(for example, 0.7 volt), the transistor of carbon nanotube of the present invention can provide a good performance only when the voltage $V_{EB}$ between the emitter and the base is a little bit negative, because, as an energy gap in the base is actually approximately "0", the little bit negative voltage $V_{EB}$ should be applied to the emitter and the base for setting up an energy level positively when holes enter into the base. In this instance, a slight reduction of an absolute value of the voltage $V_{EB}$ between the emitter and the base, which has a negative value, has an effect identical to a slight increase of a voltage $V_{EB}$ of an orderly direction between an emitter and a base in the background art transistor. When the absolute value of the voltage $V_{EB}$ between the emitter and the base, which has a negative value, is reduced slightly, a number of holes in the base is reduced slightly. This is identical to a slight provision of electrons to the base through a terminal connected to the base, with a consequential attraction of holes in the emitter toward the base, which produces a current gain. Alike the background art transistor, a strong reverse bias is applied between the base and the collector. If this is taken for a case when the emitter and the base are connected in common, since holes in the emitter is strongly attracted toward the collector, an emitter current IE and a collector current IC are almost the same like the background art transistor. Therefore, a resistance between the base and the collector is significantly higher than a resistance between the emitter and the base, producing a voltage gain and a power gain.

The aforementioned transistor of carbon nanotube of the present invention has the following advantages.

First, though the impossibility of n type doping into a carbon nanotube impede fabrication of transistor of carbon nanotube, the present invention embodies a PNP transistor using an unusual electric properties of carbon nanotube bundle.

Second, as the transistor of carbon nanotube has a size not greater than approx. 1 nanometer, a size of a device can be reduced to about 1/100 in length and about 1/10,000 in an occupied area.

Third, the formation of a transistor of carbon nanotubes having a thermal conductivity significantly higher than silicon can improve operation speed.

Fourth, the operation voltage of the transistor of carbon nanotube much lower than a silicon transistor can reduce a power consumption.

Fifth, the possibility of utilizing a metallic carbon nanotube as an electrode for applying a power to a transistor can reduce the fabrication process.

It will be apparent to those skilled in the art that various modifications and variations can be made in the transistor of the present invention without departing from the spirit or scope of the invention. Thus, it is intended that the present invention cover the modifications and variations of this invention provided they come within the scope of the appended claims and their equivalents.

What is claimed is:

1. A nanotube device, comprising:
    at least one first carbon nanotube having (n, m, n−m≠3l);
    a bundle of carbon nanotubes coupled to the at least one first carbon nanotube;
    at least one second carbon nanotube having (n, m, n−m≠3l) coupled to the bundle, wherein the at least one first carbon nanotube, the bundle of carbon nanotubes and the at least one second carbon nanotube are connected for a conduction path between the at least one first and second carbon nanotubes.

2. The device of claim 1, wherein the bundle of carbon nanotubes are (n, n) carbon nanotubes.

3. The device of claim 1, wherein the bundle of carbon nanotubes are metallic carbon nanotubes.

4. The device of claim 1, wherein the at least one first carbon nanotube and the at least one second carbon nanotube are semiconductor carbon nanotubes (CN).

5. The device of claim 1, wherein the at least one first carbon nanotube least one second carbon nanotube include one or two lines of (n, m, n−m≠3l) carbon nanotubes.

6. The device of claim 1, wherein the at least one first carbon nanotube and least one second carbon nanotube and the bundle of carbon nanotubes are coupled to receive power.

7. The device of claim 1, wherein the at least one first carbon nanotube, the at least one second carbon nanotube and the bundle of carbon nanotubes are for connection one of metallic carbon nanotubes or metal electrodes.

8. The device of claim 1, wherein the bundle has a diameter and width approximately 5 nm×6 nm, respectively.

9. The device of claim 1, wherein the at least one first carbon nanotube and the at least one second carbon nanotube are doped with "p" type impurity.

10. The device of claim 1, wherein the at least one first carbon nanotube and the at least one second carbon nanotube are doped with "p" type impurity at first and second concentrations, respectively, and wherein the first concentration si higher than the second concentration.

11. The device of claim 1, wherein a reverse bias voltage is applied between the at least one first carbon nanotube and the at least one second carbon nanotube.

12. The device of claim 1, wherein a first prescribed voltage is applied between the at least one second carbon nanotube and the bundle of carbon nanotubes, and wherein a second prescribed voltage is applied between the at least one first carbon nanotube and the bundle of carbon nanotubes.

13. The device of claim 12, wherein the first and second prescribed voltages are negative voltages, and wherein the second prescribed voltage is larger than the first prescribed voltage.

14. The device of claim 12, wherein the at least one second carbon nanotube and the at least one first carbon nanotube are coupled together through a second conduction path.

15. The device of claim 14, wherein first ends of the at least one first carbon nanotube and the at least one second carbon nanotube are coupled to the bundle of carbon nanotubes in the conduction path, wherein first and second voltage sources supply the first and second prescribed voltage, wherein second ends of the at least one first carbon nanotube and the at least one second carbon nanotube are coupled together through at a node, wherein the node is coupled to the bundle of carbon nanotubes to form the second conduction path.

16. The device of claim 14, wherein a reduction of an absolute value of the first prescribed voltage causes a current gain in the conduction path, wherein a first current flows in the at least one second carbon nanotube in the conduction path and a second current flows in the at least one first carbon nanotube in the conduction path.

17. The device of claim 16, wherein the first and second currents are approximately the same.

18. The device of claim 17, wherein a first resistance between the bundle of carbon nanotubes and the at least one first carbon nanotube is higher than a second resistance between the at least one second carbon nanotube and the bundle of carbon nanotubes.

19. The device of claim 16, wherein a reduction of an absolute value of the first prescribed voltage causes a current gain in the conduction path.

* * * * *